(12) United States Patent
Yamasaki et al.

(10) Patent No.: US 6,919,268 B1
(45) Date of Patent: Jul. 19, 2005

(54) METHOD OF MANUFACTURING A WN CONTACT PLUG

(75) Inventors: Hideaki Yamasaki, Nirasaki (JP); Yumiko Kawano, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/451,598

(22) PCT Filed: Dec. 25, 2001

(86) PCT No.: PCT/JP01/11368
§ 371 (c)(1), (2), (4) Date: Jun. 24, 2003

(87) PCT Pub. No.: WO02/058122
PCT Pub. Date: Jul. 25, 2002

(30) Foreign Application Priority Data
Dec. 25, 2000 (JP) .................... 2000-392124

(51) Int. Cl.[7] .................... H01L 21/4763
(52) U.S. Cl. .................... 438/648; 438/629; 438/685
(58) Field of Search .................... 438/629, 648, 438/685

(56) References Cited

U.S. PATENT DOCUMENTS

| 5,487,923 A | * | 1/1996 | Min et al. ............ 427/569 |
| 6,133,150 A | * | 10/2000 | Nakajima et al. .......... 438/694 |
| 6,559,050 B1 | * | 5/2003 | McKee et al. ............ 438/656 |
| 2002/0006739 A1 | * | 1/2002 | Yamamoto ............ 438/785 |

FOREIGN PATENT DOCUMENTS

| JP | 62-188268 A | 8/1987 |
| JP | 11-102877 A | 4/1999 |
| JP | 2000-188401 A | 7/2000 |

* cited by examiner

Primary Examiner—Christian Wilson
(74) Attorney, Agent, or Firm—Crowell & Moring LLP

(57) ABSTRACT

$WF_6$ is used as a source gas of tungsten, and $NH_3$ is used as a source gas of nitrogen. The partial pressure of $WF_6$ is set to be higher than that of $NH_3$. The substrate temperature is set to about 400° C. to 450° C. Tungsten nitride is deposited and then heated, to form a contact plug (106).

4 Claims, 3 Drawing Sheets

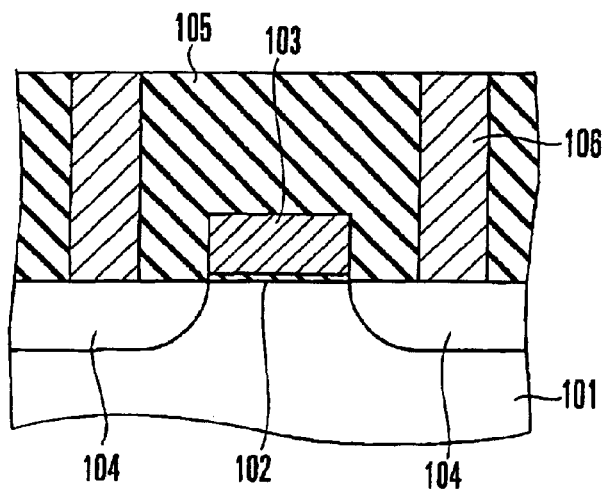
PRIOR ART  FIG. 1
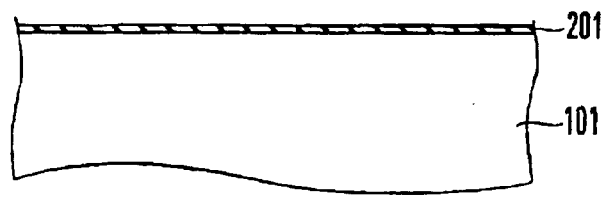
FIG. 2
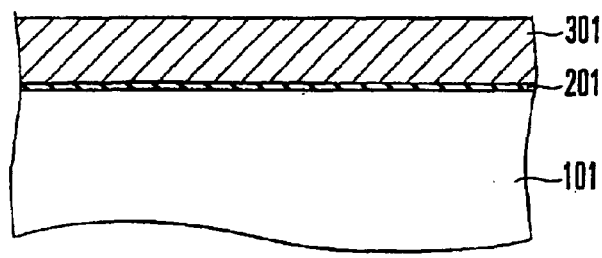
FIG. 3

METHOD OF MANUFACTURING A WN CONTACT PLUG

BACKGROUND OF THE INVENTION

The present invention relates to a method for manufacturing a semiconductor device, with which a contact plug to be connected to a transistor or the like formed on a silicon substrate is formed.

In a dynamic random access memory (DRAM) formed of one transistor and one capacitor, as the degree of integration of integrated circuits increases, demand has arisen for increasing the area of the memory cell and the storage capacity. To meet this demand, a technique has been proposed with which a material having a higher dielectric constant, e.g., tantalum oxide ($Ta_2O_5$), is used to form a dielectric film (capacitor insulating film) which forms a capacitor, so that the capacity is increased without enlarging the memory cell area.

When a material having a higher dielectric constant, e.g., tantalum oxide, is used to form a dielectric film, after a tantalum oxide film is formed, a postprocess such as annealing or UV treatment is performed, so that a desired dielectric constant can be obtained. For this purpose, an underlying layer which has already been formed when a capacitor insulating film is to be formed must have thermal resistance against the annealing. With this background, a technique has been developed with which a refractory metal such as tungsten is used to form a contact plug for connecting the transistor of the memory cell and a capacitor to each other, thus decreasing the resistance.

The arrangement of the contact plug described above will be briefly described by way of an example in which the contact plug is to be connected to a transistor. As shown in FIG. 8, a transistor formed of a gate electrode 803 and source and drain 804 is formed on a silicon substrate 801. The gate electrode 803 Is formed through a gate Insulating film 802, and an impurity region is formed by ion implantation using the gate electrode 803 as a mask, thus forming the source and drain 804.

In the above arrangement, contact plugs 806 to be connected to the source and drain 804 are formed in an interlayer dielectric film 805 formed over the entire area of the silicon substrate 801 including the portion above the gate electrode 803. Each contact plug 806,is formed of a titanium layer 806a, TlN layer 806b, and filled portion 806cof tungsten. The respective layers of titanium, TlN, and tungsten are formed by chemical vapor deposition (CVD) or the like.

The titanium layer 806a is provided to decrease the contact resistance at the interface of the silicon substrate 801. The TiN layer 806b ensures high bonding strength between tungsten and the substrate. The contact plug 806 is basically made of tungsten. When tungsten is used, a comparatively low resistance can be obtained. It is also possible to bury a thick TiN layer 806b, so that the contact plug can be formed of only TiN.

As a smaller feature size is demanded to increase the degree of integration, it has become necessary to realize a higher aspect ratio in forming a contact plug. The conventional contact plug described above, however, is becoming difficult to form with a higher aspect ratio. This is because as the aspect ratio increases, to bury tungsten becomes difficult. When a contact plug is to be formed by forming a thick TlN layer, although the TiN film can be buried in a hole having a high aspect ratio, as the thickness of the TiN film increases, the stress of TiN increases, and problems such as cracking in the formed contact plug occur.

SUMMARY OF THE INVENTION

The present invention has been made to solve the problems described above, and has as its object to be able to form a contact plug having a higher aspect ratio.

According to a method for manufacturing a semiconductor device according to one aspect of the present invention, an interlayer dielectric film is formed on a silicon substrate. A contact hole is formed in the interlayer dielectric film to reach the silicon substrate. A substrate temperature is set to a predetermined temperature and a source gas of nitrogen and a source gas of tungsten having a higher partial pressure than that of the source gas of nitrogen are supplied to form a film of tungsten nitride on the interlayer dielectric film by thermal chemical vapor deposition. The contact hole is filled with tungsten nitride, thus forming a contact plug. The formed contact plug is heated.

According to the present invention, a contact plug made of nitrogen and tungsten is formed.

BRIEF DESCRIPTION OF DRAWINGS

FIG. 1 is a sectional view schematically showing the arrangement of part of a semiconductor device manufactured in an embodiment of the present invention;

FIG. 2 is a sectional view schematically showing a state during the manufacture in the embodiment of the present invention;

FIG. 3 is a sectional view schematically showing a state during the manufacture that follows FIG. 2:

DETAILED DESCRIPTION OF THE EMBODIMENT

Figure 4:
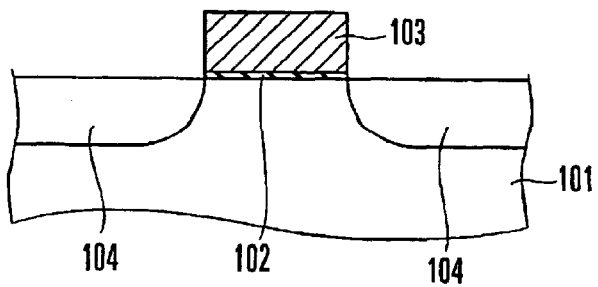
FIG. 4 is a sectional view schematically showing a state during the manufacture that follows FIG. 3.

An embodiment of the present invention will be described with reference to the accompanying drawings.

FIG. 1 is a sectional view showing the schematic arrangement of a semiconductor device according to an embodiment of the present invention. In this embodiment. For example, a contact plug to be connected to the source/drain portion of a transistor formed on a semiconductor substrate is formed of tungsten nitride.

According to this embodiment, as shown in FIG. 1, contact plugs 106 of tungsten nitride are connected to a transistor formed of a gate insulating film 102, gate electrode 103, and source and drain 104 through an interlayer dielectric film 105. Each contact plug 106 is to be connected to, e.g., a capacitor (not shown) to be formed on the interlayer dielectric film 105.

A method for manufacturing the semiconductor device of FIG. 1 will be described.

First, as shown in FIG. 2, an oxide film 201 is formed on a silicon substrate 101 by, e.g., thermal oxidation.

Subsequently, as shown in FIG. 3, a conductor film 301 of, e.g., heavily doped polysilicon, is formed on the oxide film 201. For example, the conductor film 301 can be formed by depositing polysilicon in accordance with chemical vapor deposition (CVD).

A mask pattern made of a photoresist is formed on the conductor film 301 with a known photolithography technique. Using the mask pattern as a mask, the conductor film 301 is processed by a known dry etching technique, to form a gate electrode 103 on a gate insulating film 102, as shown in FIG. 4. After the gate electrode 103 is formed, an impurity is selectively ion-implanted in the silicon substrate 101 by using the gate electrode 103 as a mask, thus forming source and drain 104.

Figure 5:
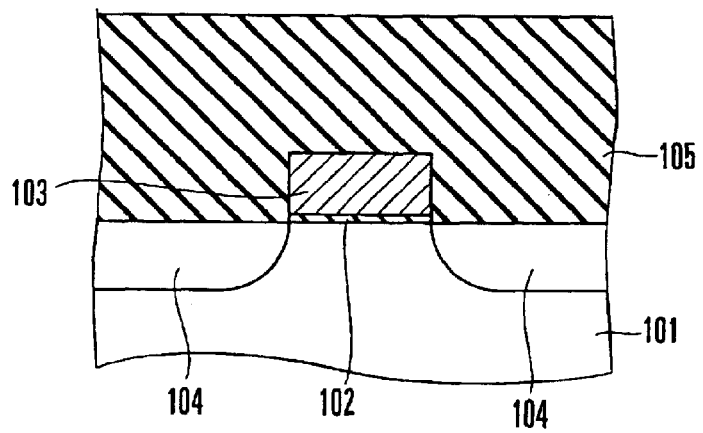
FIG. 5 is a sectional view schematically showing a state during the manufacture that follows FIG. 4.

As shown in FIG. 5, an interlayer dielectric film 105 is formed on the silicon substrate 101 to cover the gate electrode 103. For example, the interlayer dielectric film 105 can be formed by depositing silicon oxide on the silicon substrate 101.

Figure 6:
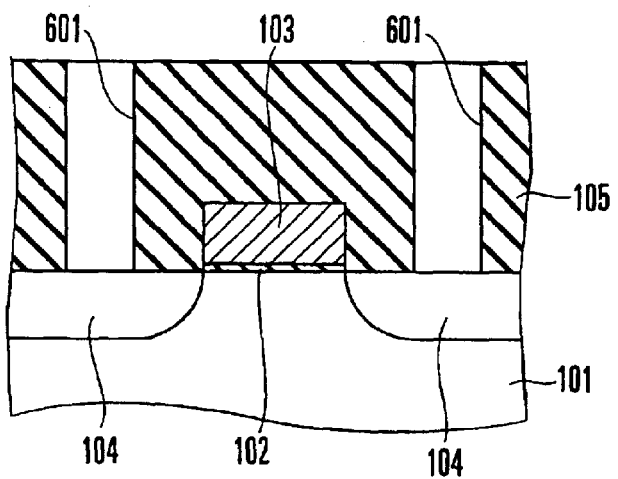
FIG. 6 is a sectional view schematically showing a state during the manufacture that follows FIG. 5.

A resist pattern having an opening at a predetermined position and made of a photoresist is formed on the interlayer dielectric film 105. By using the resist pattern as a mask, the interlayer dielectric film 105 is selectively etched to form contact holes 601 in the interlayer dielectric film 105, as shown in FIG. 6. The contact holes 601 are formed to expose the perspective source and drain 104 formation regions of the silicon substrate 101 at their bottom surfaces.

Figure 7:
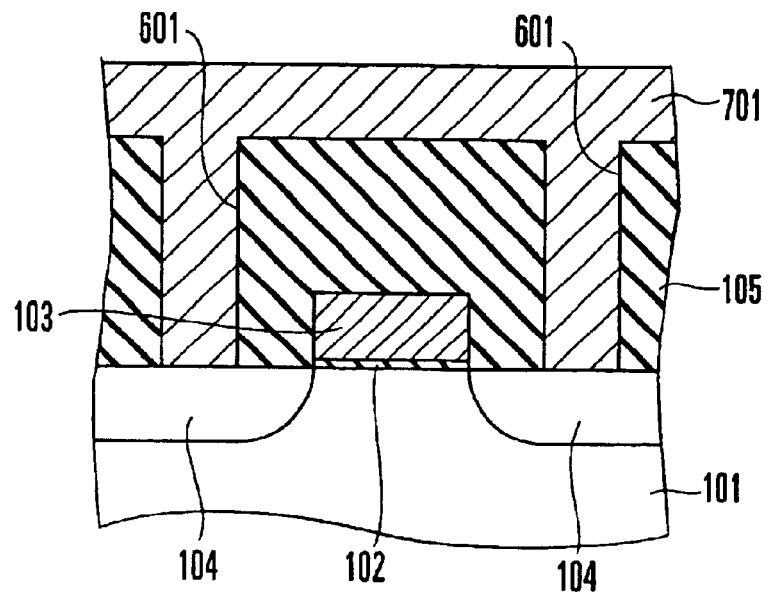
FIG. 7 is a sectional view schematically showing a state during the manufacture that follows FIG. 6.
Figure 8:
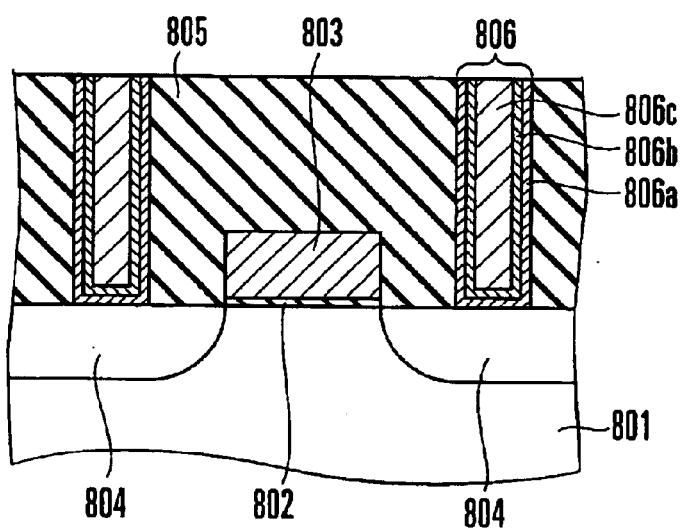
FIG. 8 is a sectional view showing the arrangement of a conventional semiconductor device.

As shown in FIG. 7, a tungsten nitride film 701 is formed to fill the contact holes 601. Formation of the tungsten nitride film 701 will be described. The tungsten nitride film can be formed by using tungsten hexafluoride ($WF_6$) as the source gas of tungsten and ammonia ($NH_3$) as the source gas of nitrogen in accordance with CVD at a substrate temperature of about 400° C. to 450° C.

At this time. in an apparatus for performing deposition (process vessel), the partial pressure of $WF_6$ is set to be higher than that of $NH_3$, so that tungsten nitride is formed with good step coverage. The tungsten nitride film 701 can be formed to fill the contact holes 601 with no space. Tungsten nitride formed in this manner has a low stress of 0.2 GPa to 0.3 GPa. Even if each contact hole has a diameter of 0.3 $\mu$m and a depth of 3 $\mu$m, it can be filled with tungsten nitride.

After the tungsten nitride film 701 is formed, it is heated in the following manner, so that nitrogen is externally diffused, thus decreasing the resistance. For example, when annealing at 650° C. for 60 sec is added, the resistance of the tungsten nitride film 701 becomes about half (1,700 $\mu\Omega$cm). When annealing at 90° C. for 600 sec is performed, the resistance decreases to 15 $\mu\Omega$cm. This heating also forms an alloy layer of tungsten, silicon, and nitride on the interface between the tungsten nitride film 701 and silicon substrate 101.

After that, the formed tungsten nitride film 701 is etched back by, e.g., chemical mechanical polishing (CMP), to remove substances other than tungsten nitride filled in the contact holes 601, thus forming contact plugs 106 of tungsten nitride, as shown in FIG. 1.

For example, sources gases of tungsten hexafluoride and ammonia were supplied at partial pressures of 17 Pa and 8 Pa, respectively, and the substrate temperature was set to 500° C. A 50-nm thick tungsten nitride film was formed on an interlayer dielectric film including contact holes to fill the contact holes with tungsten nitride. After that, annealing at 900° C. for 60 sec was performed in a low-pressure $N_2$ atmosphere. Nitrogen externally diffused from the tungsten nitride film. Plugs each having a resistivity of 20 $\mu\Omega$cm were obtained.

Sources gases of tungsten hexafluorlde and ammonia were supplied at partial pressures of 9 Pa and 8 Pa, respectively, and the substrate temperature was set to 450° C. A 50-nm thick tungsten nitride film was formed on an interlayer dielectric film including contact holes to fill the contact holes with tungsten nitride. After that, annealing at 850° C. for 90 sec was performed in a vacuum discharge atmosphere of 1.3 Pa. Nitrogen externally diffused from the tungsten nitride film. Plugs each having a resistivity of 15 $\mu\Omega$cm were obtained.

In the above description, the tungsten nitride film 701 was etched back finally, but the present invention is not limited to this. After the tungsten nitride film 701 is etched back, the heat described above may be applied to it.

As has been described above, according to the present invention, the contact plug is formed of tungsten nitride. Thus, an excellent effect that a contact plug having a higher aspect ratio can be formed can be obtained.

As described above, the method for manufacturing a semiconductor device according to the present invention is suitable when manufacturing a semiconductor device which uses a contact plug having a higher aspect ratio.

What is claimed is:

1. A method for manufacturing a semiconductor device, comprising forming an interlayer dielectric film on a silicon substrate, forming a contact hole in the interlayer dielectric film to reach the silicon substrate, setting a substrate temperature to a predetermined temperature and supplying a source gas of nitrogen and a source gas of tungsten having a higher partial pressure than that of the source gas of nitrogen, thus forming a film of tungsten nitride on the interlayer dielectric film by thermal chemical vapor deposition, and filling the contact hole with tungsten nitride, thus forming a contact plug, and heating the contact plug.

2. A method for forming a semiconductor device according to claim 1, wherein in heating the contact plug, an alloy layer of tungsten, silicon, and nitride is formed at an interface between the contact plug and the silicon substrate.

3. A method for forming a semiconductor device according to claim 1, wherein in heating the contact plug, nitrogen is externally diffused from the contact plug.

4. A method for forming a semiconductor device according to any one of claims 1 to 3, wherein formed on the semiconductor substrate under the is provided, and the contact plug is formed to be connected to the transistor.

* * * * *